United States Patent
Ikeda et al.

(10) Patent No.: US 9,231,154 B2
(45) Date of Patent: Jan. 5, 2016

(54) LIGHT-EMITTING DEVICE

(71) Applicants: Hisao Ikeda, Zama (JP); Takuya Kawata, Atsugi (JP); Manabu Niboshi, Osaka (JP); Katsuhiro Kikuchi, Osaka (JP); Shinichi Kawato, Osaka (JP); Takashi Ochi, Osaka (JP); Yuto Tsukamoto, Osaka (JP); Tomohiro Kosaka, Osaka (JP); Tomofumi Osaki, Osaka (JP)

(72) Inventors: Hisao Ikeda, Zama (JP); Takuya Kawata, Atsugi (JP); Manabu Niboshi, Osaka (JP); Katsuhiro Kikuchi, Osaka (JP); Shinichi Kawato, Osaka (JP); Takashi Ochi, Osaka (JP); Yuto Tsukamoto, Osaka (JP); Tomohiro Kosaka, Osaka (JP); Tomofumi Osaki, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

( * ) Notice: Subject to any disclaimer, the term of this patent is extended or adjusted under 35 U.S.C. 154(b) by 36 days.

(21) Appl. No.: 14/169,920

(22) Filed: Jan. 31, 2014

(65) Prior Publication Data

US 2014/0225102 A1 Aug. 14, 2014

(30) Foreign Application Priority Data

Feb. 8, 2013 (JP) .................................. 2013-023576

(51) Int. Cl.
*H01L 33/00* (2010.01)
*H01L 33/26* (2010.01)
*H01L 51/50* (2006.01)
(Continued)

(52) U.S. Cl.
CPC .............. *H01L 33/26* (2013.01); *H01L 51/504* (2013.01); *H01L 51/5225* (2013.01); *H01L 51/5265* (2013.01); *H01L 51/5268* (2013.01); *H01L 27/322* (2013.01)

(58) Field of Classification Search
CPC ......... H01L 33/00; H01L 33/40; H01L 33/42; H01L 51/5036; H01L 51/52; H01L 51/5203; H01L 51/5206; H01L 51/5218; H01L 33/36
USPC ................ 257/79, 88, 89, E33.063, E33.064; 438/34, 35
See application file for complete search history.

(56) References Cited

U.S. PATENT DOCUMENTS

| | | | |
|---|---|---|---|
| 7,166,959 B2 | 1/2007 | Suzuki et al. | |
| 7,554,265 B2 | 6/2009 | Godo et al. | |
| 7,601,988 B2 | 10/2009 | Seo et al. | |

(Continued)

FOREIGN PATENT DOCUMENTS

| | | |
|---|---|---|
| JP | 2005-197011 | 7/2005 |
| JP | 2010-056015 | 3/2010 |

*Primary Examiner* — Kenneth Parker
*Assistant Examiner* — John Lin
(74) *Attorney, Agent, or Firm* — Eric J. Robinson; Robinson Intellectual Property Law Office, P.C.

(57) ABSTRACT

The emission efficiency of a light-emitting device including a microcavity structure is improved. The light-emitting device includes a plurality of light-emitting elements. The plurality of light-emitting elements each include a reflective electrode, a transparent electrode, a plurality of light-emitting layers, and a semi-transmissive and semi-reflective electrode stacked in that order. The plurality of light-emitting layers emit light of different colors. A surface roughness of the transparent electrode in the light-emitting element which is among the plurality of light-emitting elements and in which light emitted from the light-emitting layer closest to the reflective electrode is amplified and emitted outside is greater than surface roughnesses of the transparent electrodes in the other light-emitting elements.

14 Claims, 4 Drawing Sheets

(51) Int. Cl.
*H01L 51/52* (2006.01)
*H01L 27/32* (2006.01)

(56) References Cited

U.S. PATENT DOCUMENTS

| | | | |
|---|---|---|---|
| 7,893,427 | B2 | 2/2011 | Kumaki et al. |
| 8,269,227 | B2 | 9/2012 | Yamazaki et al. |
| 8,618,574 | B2 | 12/2013 | Kumaki et al. |
| 2006/0163597 | A1 | 7/2006 | Noda et al. |
| 2007/0001570 | A1 | 1/2007 | Nomura et al. |
| 2007/0176161 | A1 | 8/2007 | Seo et al. |
| 2008/0233669 | A1 | 9/2008 | Hirakata et al. |
| 2011/0291088 | A1 | 12/2011 | Seo et al. |
| 2011/0309351 | A1 | 12/2011 | Kumaki et al. |
| 2012/0205676 | A1* | 8/2012 | Seo et al. ............... 257/88 |
| 2012/0205685 | A1 | 8/2012 | Seo et al. |
| 2012/0205686 | A1 | 8/2012 | Seo et al. |
| 2012/0205701 | A1 | 8/2012 | Sasaki et al. |
| 2012/0206675 | A1 | 8/2012 | Seo et al. |
| 2012/0223346 | A1 | 9/2012 | Ohsawa et al. |
| 2012/0235126 | A1 | 9/2012 | Yamazaki et al. |
| 2012/0243219 | A1 | 9/2012 | Ohsawa et al. |
| 2012/0256208 | A1 | 10/2012 | Hatano |
| 2012/0273822 | A1 | 11/2012 | Ohsawa et al. |
| 2013/0032841 | A1 | 2/2013 | Jinbo et al. |
| 2013/0264549 | A1 | 10/2013 | Yamazaki et al. |
| 2013/0265320 | A1 | 10/2013 | Yamazaki et al. |

\* cited by examiner

FIG. 4 indium-zinc oxide film
APC film
100nm

FIG. 5

ITO film
APC film
100nm

FIG. 6

LIGHT-EMITTING DEVICE

BACKGROUND OF THE INVENTION

1. Field of the Invention

The present invention relates to a light-emitting device including a microcavity structure.

2. Description of the Related Art

One of techniques for providing a full-color organic EL display is to use a white light-emitting element with a tandem structure in combination with a color filter. A tandem structure is a structure in which a plurality of light-emitting units are stacked. Note that in this specification and the like, a light-emitting unit refers to a layer or a stacked body which includes at least one region where electrons and holes injected from both ends are recombined. A light-emitting element with a tandem structure can provide high luminance with a small amount of current. For example, a light-emitting element in which two light-emitting units are stacked can provide light emission comparable to that of a light-emitting element having one light-emitting unit when current with half the density of current that flows through the light-emitting element having one light-emitting unit is made to flow through each light-emitting unit. For example, a structure in which n light-emitting units are stacked between electrodes can provide n times the luminance of one light-emitting unit without an increase in current density.

This technique of using a white light-emitting element with a tandem structure in combination with a color filter has the following advantage: it is not necessary to provide separate light-emitting layers for respective sub-pixels (e.g., three sub-pixels of R, G, and B), which leads to high yield and easy manufacture of high-resolution displays. Moreover, it is possible to improve the color purity of light emitted from each sub-pixel by applying a microcavity structure to a pixel provided with the white light-emitting element and the color filter.

Figure 6:
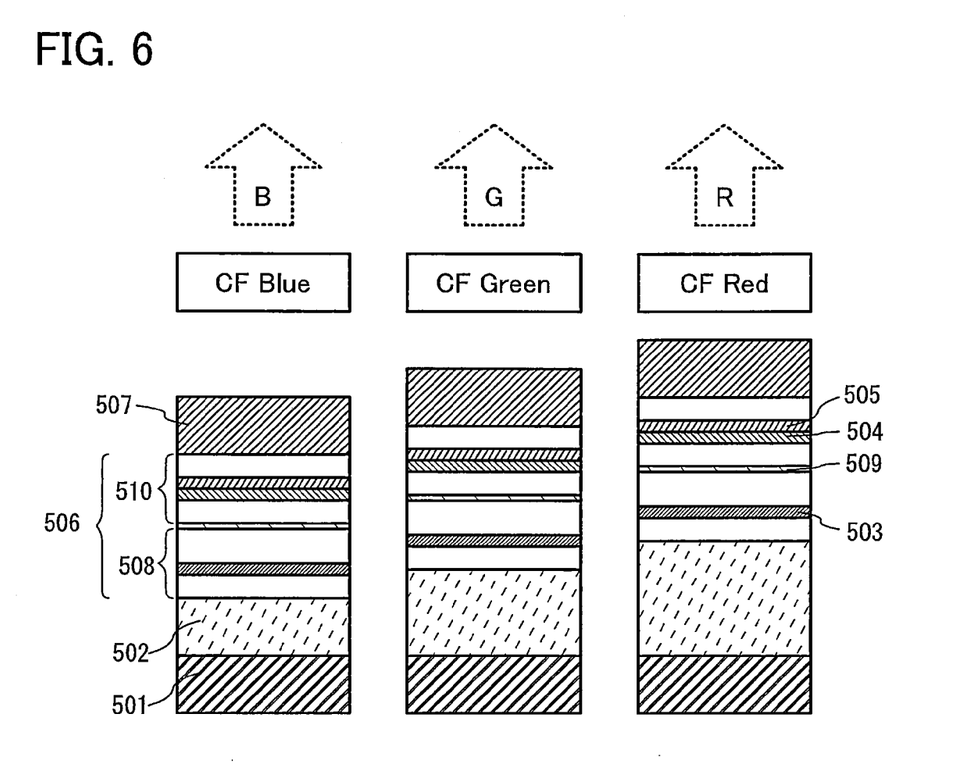
FIG. 6 is a schematic view of a conventional light-emitting device.

In particular, a microcavity structure can be formed relatively easily in a top-emission light-emitting element in such a manner that a reflective electrode, an EL layer, and a semi-transmissive and semi-reflective electrode are formed in that order from the substrate side and a transparent electrode is formed as an optical adjustment layer between the reflective electrode and the EL layer. FIG. 6 illustrates a structural example of a pixel that is provided with a light-emitting element with a microcavity structure and a color filter.

A conventional light-emitting device in FIG. 6 includes light-emitting elements in each of which a reflective electrode 501, a transparent electrode 502, an EL layer 506, and a semi-transmissive and semi-reflective electrode 507 are stacked in that order. Over the light-emitting elements, a red color filter (CF Red), a green color filter (CF Green), and a blue color filter (CF Blue) are provided.

The EL layer 506 has a structure in which a first light-emitting unit 508 including a first light-emitting layer 503, an intermediate layer 509, and a second light-emitting unit 510 including a second light-emitting layer 504 and a third light-emitting layer 505 are stacked in that order. The first light-emitting layer 503 emits blue light, the second light-emitting layer 504 emits green light, and the third light-emitting layer 505 emits red light. The intermediate layer 509 preferably has a structure in which, for example, an electron-injection buffer layer, an electron-relay layer, and a charge generation layer are stacked in that order from the anode side.

The above light-emitting device includes a microcavity structure. An optical length L between the reflective electrode 501 serving as a reflecting mirror and the semi-transmissive and semi-reflective electrode 507 is adjusted so that light emitted from the EL layer 506 is repeatedly reflected between the reflective electrode 501 and the semi-transmissive and semi-reflective electrode 507; thus, light with a specific wavelength can be selectively amplified and emitted outside.

To perform full-color display with the above light-emitting device, light with wavelengths for three colors, red (R), green (G), and blue (B), is to be amplified, for example, in one display panel. Accordingly, light of colors that correspond to three sub-pixels of R, G, and B needs to be amplified. To achieve that, the thickness of the transparent electrode 502 is varied to provide optical lengths L corresponding to the three wavelengths for R, G, and B (e.g., see Patent Document 1).

REFERENCE

Patent Document

[Patent Document 1] Japanese Published Patent Application No. 2005-197011

SUMMARY OF THE INVENTION

It is required that the emission efficiency of the above light-emitting device be improved.

It is effective for improvement of emission efficiency to use a material with high reflectivity for a reflective electrode. In some cases, however, the emission efficiency is not improved even when a material with high reflectivity is used. For example, a material with high reflectivity is used for the reflective electrodes in the element structures shown in FIG. 6. In that case, when the transparent electrodes of all the light-emitting elements are formed using the same material, some light-emitting element(s) might have decreased efficiency while other light-emitting element(s) have increased efficiency.

An object of one embodiment of the present invention is to improve the emission efficiency of a light-emitting device including a microcavity structure.

One embodiment of the present invention is a light-emitting device including a plurality of light-emitting elements. The plurality of light-emitting elements each include a reflective electrode, a transparent electrode, a plurality of light-emitting layers, and a semi-transmissive and semi-reflective electrode stacked in that order. The plurality of light-emitting layers emit light of different colors. A surface roughness of the transparent electrode in the light-emitting element which is among the plurality of light-emitting elements and in which light emitted from the light-emitting layer closest to the reflective electrode is amplified and emitted outside is greater than surface roughnesses of the transparent electrodes in the other light-emitting elements.

In the light-emitting device of one embodiment of the present invention, it is preferable that the transparent electrode in the light-emitting element in which light emitted from the light-emitting layer closest to the reflective electrode is amplified and emitted outside include a polycrystalline conductive oxide and the transparent electrodes in the other light-emitting elements include an amorphous conductive oxide.

In the light-emitting device of one embodiment of the present invention, it is preferable that a surface of the transparent electrode in the light-emitting element in which light emitted from the light-emitting layer closest to the reflective electrode is amplified and emitted outside include a polycrystalline conductive oxide and surfaces of the transparent electrodes in the other light-emitting elements include an amorphous conductive oxide.

In the light-emitting device of one embodiment of the present invention, it is preferable that the polycrystalline conductive oxide be ITO, zinc oxide, aluminum-zinc oxide, gallium-zinc oxide, or fluorine-tin oxide and the amorphous conductive oxide be indium-zinc oxide or indium-tungsten oxide.

In the light-emitting device of one embodiment of the present invention, the plurality of light-emitting elements preferably include color filters of different colors.

In the light-emitting device of one embodiment of the present invention, the transparent electrodes of the plurality of light-emitting elements preferably have different thicknesses.

In the light-emitting device of one embodiment of the present invention, the plurality of light-emitting elements preferably include a first light-emitting element from which blue light is extracted, a second light-emitting element from which green light is extracted, and a third light-emitting element from which red light is extracted. The first light-emitting element, the second light-emitting element, and the third light-emitting element each preferably include the plurality of light-emitting layers. The plurality of light-emitting layers preferably include a first light-emitting layer emitting blue light, a second light-emitting layer emitting green light, and a third light-emitting layer emitting red light.

Note that a light-emitting device in this specification includes a display device having a light-emitting element in a pixel (or a sub-pixel).

With one embodiment of the present invention, the emission efficiency of a light-emitting device including a microcavity structure can be improved.

DETAILED DESCRIPTION OF THE INVENTION

Hereinafter, embodiments and an example of the present invention will be described in detail with reference to the accompanying drawings. Note that the present invention is not limited to the following description, and it is easily understood by those skilled in the art that the mode and details can be variously changed without departing from the scope and spirit of the present invention. Therefore, the present invention is not construed as being limited to description of the embodiments and the example.

(Embodiment 1)

Figure 1:
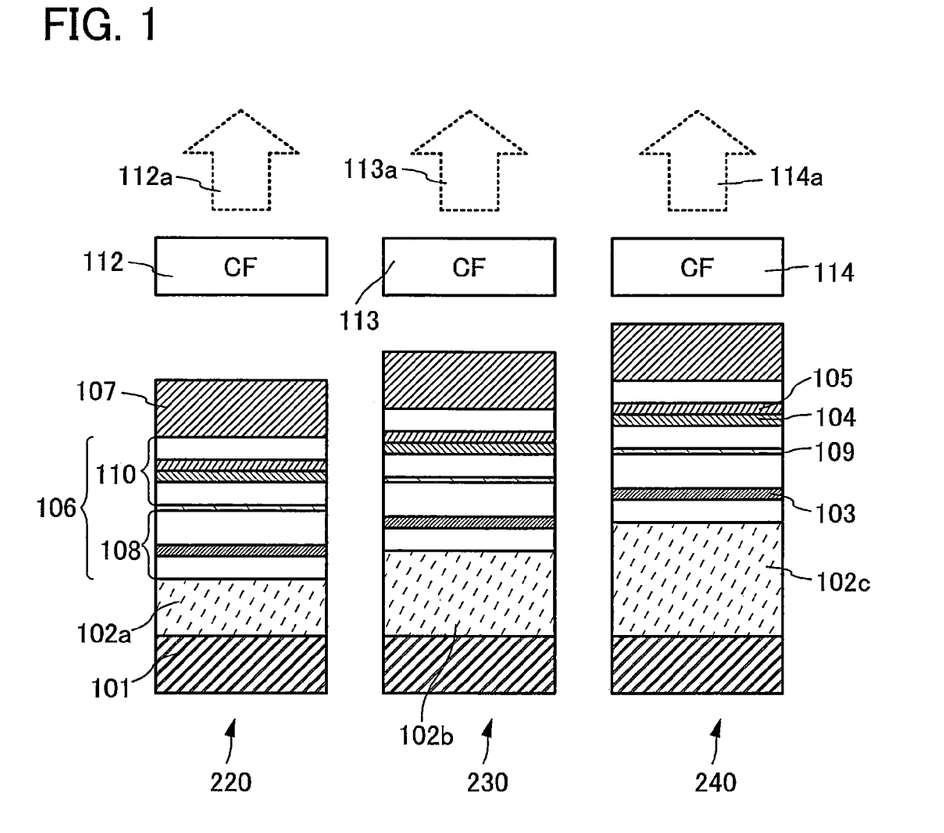
FIG. 1 is a schematic view of a light-emitting device of one embodiment of the present invention.

FIG. 1 is a schematic view of a light-emitting device of one embodiment of the present invention. The light-emitting device includes top-emission white light-emitting elements (light-emitting elements 220, 230, and 240). In each light-emitting element, a reflective electrode 101, a layer 106 containing a light-emitting organic compound (such a layer is hereinafter also referred to as EL layer), and a semi-transmissive and semi-reflective electrode 107 are stacked in that order from the substrate (not shown) side. Further, transparent electrodes 102a, 102b, and 102c, each of which serves as an optical adjustment layer between the reflective electrode 101 and the EL layer 106, are formed in the respective light-emitting elements. The transparent electrodes 102a, 102b, and 102c differ in thickness; the transparent electrode 102a is the thinnest and the transparent electrode 102c is the thickest. With this structure, an optical length L between the reflective electrode 101 serving as a reflecting mirror and the semi-transmissive and semi-reflective electrode 107 can be adjusted, so that light emitted from the EL layer 106 can be selectively amplified and emitted outside. Consequently, a light-emitting element with a microcavity structure can be formed.

One of the semi-transmissive and semi-reflective electrode 107 and the transparent electrode 102a (or 102b, 102c) serves as an anode, and the other serves as a cathode. In this embodiment, the semi-transmissive and semi-reflective electrode 107 is the cathode and the transparent electrode 102a (or 102b, 102c) is the anode. The transparent electrode 102a (or 102b, 102c) may be in contact with the reflective electrode 101, or a light-transmitting layer may be provided therebetween.

When a voltage higher than the threshold voltage of the light-emitting element is applied between the anode and the cathode, holes are injected to the EL layer 106 from the anode side and electrons are injected to the EL layer 106 from the cathode side. The injected electrons and holes are recombined in the EL layer 106 and a light-emitting substance contained in the EL layer 106 emits light.

The EL layer 106 has a structure in which a first light-emitting unit 108 including a first light-emitting layer 103, an intermediate layer 109, and a second light-emitting unit 110 including a second light-emitting layer 104 and a third light-emitting layer 105 are stacked in that order.

The intermediate layer 109 includes at least a charge generation layer, and may have a structure in which the charge generation layer and a layer other than the charge generation layer are stacked. For example, a structure in which an electron-injection buffer layer, an electron-relay layer, and a charge generation layer are stacked in that order may be employed.

The holes injected into the third light-emitting layer 105 provided on the cathode side are recombined with the electrons injected from the cathode, so that a light-emitting substance contained in the third light-emitting layer 105 emits light. The holes injected into the second light-emitting layer 104 from the anode side are recombined with the electrons injected from the cathode side, so that the light-emitting substance contained in the second light-emitting layer 104 emits light. The electrons injected from the cathode side into the first light-emitting layer 103 provided on the anode side are recombined with the holes injected from the anode side, so that a light-emitting substance contained in the first light-emitting layer 103 emits light. Thus, the holes and electrons generated in the intermediate layer 109 cause light emission in different light-emitting layers.

Note that in this embodiment, three light-emitting layers are formed; alternatively, two light-emitting layers or four or more light-emitting layers may be formed. Further, in this embodiment, two light-emitting units are formed; alternatively, three or more light-emitting units may be formed.

A first color filter (CF) 112, a second color filter (CF) 113, and a third color filter (CF) 114 are arranged over the respective semi-transmissive and semi-reflective electrodes 107. The first color filter 112 has a first color, the second color filter 113 has a second color, and the third color filter 114 has a third color.

The first light-emitting element 220, which includes the reflective electrode 101, the transparent electrode 102a, the EL layer 106, and the semi-transmissive and semi-reflective electrode 107, is placed below the first color filter 112. The second light-emitting element 230, which includes the reflective electrode 101, the transparent electrode 102b, the EL layer 106, and the semi-transmissive and semi-reflective electrode 107, is placed below the second color filter 113. The third light-emitting element 240, which includes the reflective electrode 101, the transparent electrode 102c, the EL layer 106, and the semi-transmissive and semi-reflective electrode 107, is placed below the third color filter 114.

Note that in this embodiment, three light-emitting elements are formed; alternatively, two light-emitting elements or four or more light-emitting elements that emit light of different colors may be formed.

In the first light-emitting element 220, the light-emitting layer from which light is to be extracted is the first light-emitting layer 103. The first light-emitting layer 103 emits light of the first color, which passes through the first color filter 112; accordingly, light 112a that has passed through the first color filter has the first color. Here, the first color is blue. In the second light-emitting element 230, the light-emitting layer from which light is to be extracted is the second light-emitting layer 104. The second light-emitting layer 104 emits light of the second color, which passes through the second color filter 113; accordingly, light 113a that has passed through the second color filter has the second color. Here, the second color is green. In the third light-emitting element 240, the light-emitting layer from which light is to be extracted is the third light-emitting layer 105. The third light-emitting layer 105 emits light of the third color, which passes through the third color filter 114; accordingly, light 114a that has passed through the third color filter has the third color. Here, the third color is red.

As shown in FIG. 1, among the first to third light-emitting elements 220, 230, and 240, the light-emitting element in which light is to be extracted from the light-emitting layer closest to the reflective electrode 101 is the first light-emitting element 220. The surface roughness of the transparent electrode 102a in the first light-emitting element 220 is greater than those of the transparent electrodes 102b and 102c in the other light-emitting elements (the second and third light-emitting elements 230 and 240).

To vary the surface roughnesses of the transparent electrodes, a polycrystalline conductive oxide material is used for the transparent electrode 102a and an amorphous conductive oxide material is used for the transparent electrodes 102b and 102c. This can make the transparent electrode 102a have a large surface roughness and the transparent electrodes 102b and 102c have small surface roughnesses.

Examples of a conductive oxide material that tends to be polycrystalline include ITO, zinc oxide, aluminum-zinc oxide, gallium-zinc oxide, and fluorine-tin oxide. Examples of a conductive oxide material that tends to be amorphous include indium-zinc oxide and indium-tungsten oxide. Note that, in some cases, a conductive oxide film including any of the above materials can be either polycrystalline or amorphous depending on formation conditions.

Figure 2A:
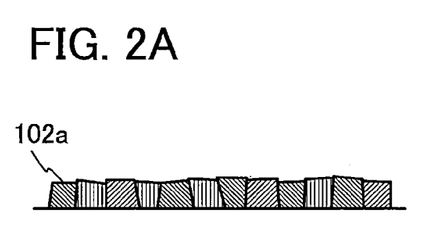
FIG. 2A is a schematic view of a polycrystalline conductive oxide film.
Figure 2B:
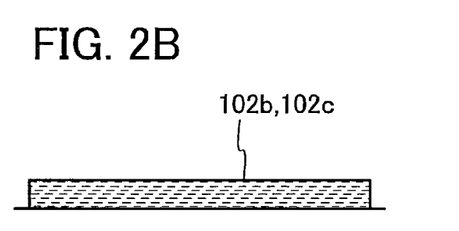
FIG. 2B is a schematic view of an amorphous conductive oxide film.

FIG. 2A is a schematic view of a polycrystalline conductive oxide film. The polycrystalline conductive oxide film includes columnar crystal grains, for example; thus, its outermost surface is significantly uneven. FIG. 2B is a schematic view of an amorphous conductive oxide film. The amorphous conductive oxide film has no crystal grains; thus, its outermost surface is relatively smooth. Moreover, even if a surface on which the amorphous conductive oxide film is formed (the surface of the reflective electrode 101) is uneven, the amorphous conductive oxide film can cover the uneven surface; thus, the flatness of the outermost surface of the amorphous conductive oxide film is increased.

In this embodiment, among the first to third light-emitting elements 220, 230, and 240, the light-emitting element in which light is to be extracted from the light-emitting layer closest to the reflective electrode 101 is the first light-emitting element 220. The surface roughness of the transparent electrode 102a in the first light-emitting element 220 is made greater than those of the transparent electrodes 102b and 102c in the other light-emitting elements (the second and third light-emitting elements 230 and 240). In this manner, the emission efficiency of a light-emitting device (e.g., an organic EL display) including a light-emitting element with a tandem structure and a microcavity structure can be improved.

Note that in this embodiment, light is to be extracted from the light-emitting layer closest to the reflective electrode 101 in the first light-emitting element 220. In the first light-emitting element 220, the light-emitting layer from which light is to be extracted is the first light-emitting layer 103, and the color of light that is emitted from the first light-emitting layer 103 is blue. However, one embodiment of the present invention is not limited thereto. A light-emitting layer that emits light of a color other than blue may be the closest to the reflective electrode 101.

(Embodiment 2)
<Structure of Display Panel>

Figure 3A:
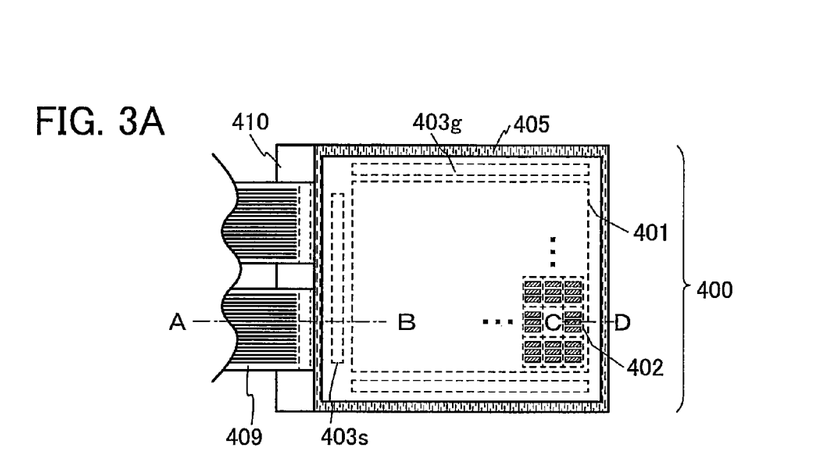
FIG. 3A is a top view of a structure of a display panel which can be used for a display device of one embodiment of the present invention.
Figure 3B:
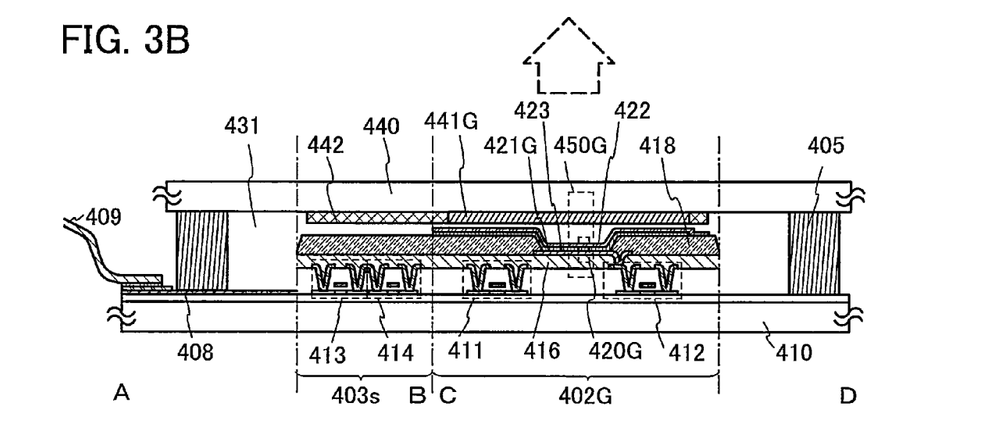
FIG. 3B is a side view of the structure including cross sections along section lines A-B and C-D in FIG. 3A.

FIGS. 3A and 3B illustrate a structure of a display panel which can be used for a display device of one embodiment of the present invention. FIG. 3A is a top view of the structure of the display panel which can be used for a display device of one embodiment of the present invention, and FIG. 3B is a side view of the structure including cross sections along section lines A-B and C-D in FIG. 3A.

A display panel 400 shown as an example in this embodiment includes a display portion 401 over a first substrate 410. The display portion 401 includes a plurality of pixels 402. The pixel 402 includes a plurality of sub-pixels (e.g., three sub-pixels) (FIG. 3A). The first to third light-emitting elements 220, 230, and 240 shown in FIG. 1 can be used for the three sub-pixels. Over the first substrate 410, in addition to the display portion 401, a source side driver circuit portion 403s and a gate side driver circuit portion 403g which drive the display portion 401 are provided. Note that the driver circuit portions can be provided not over the first substrate 410 but externally.

The display panel 400 includes an external input terminal and receives a video signal, a clock signal, a start signal, a reset signal, and the like from an FPC (flexible printed circuit) 409.

A sealant 405 bonds the first substrate 410 and a second substrate 440. The display portion 401 is sealed in a space 431 formed between the substrates (see FIG. 3B).

The structure including the cross sections of the display panel 400 is described with reference to FIG. 3B. The display panel 400 includes the source side driver circuit portion 403s, a sub-pixel 402G that is included in the pixel 402 and emits green light, and a lead wiring 408. Note that the display portion 401 of the display panel 400 shown as an example in this embodiment emits light in the direction denoted by the arrow in the drawing, thereby displaying images.

The source side driver circuit portion 403s includes a CMOS circuit which is a combination of an n-channel transistor 413 and a p-channel transistor 414. Note that the driver circuit is not limited to this structure and may be various circuits, such as a CMOS circuit, a PMOS circuit, or an NMOS circuit.

The lead wiring 408 transmits a signal input from the external input terminal to the source side driver circuit portion 403s and the gate side driver circuit portion 403g.

The sub-pixel 402G includes a switching transistor 411, a current control transistor 412, and a light-emitting module 450G Note that the second light-emitting element 230 in FIG. 1 can be used for the light-emitting module 450G. An insulating layer 416 and a partition 418 are formed over the transistor 411 and the like. The light-emitting module 450G includes a reflective film, a semi-transmissive and semi-reflective film, a light-emitting element 420G between the reflective film and the semi-transmissive and semi-reflective film, and a color filter 441G (corresponding to the second color filter (CF) 113 in FIG. 1) provided on the semi-transmissive and semi-reflective film side through which light emitted from the light-emitting element 420G is extracted. In the light-emitting module 450G shown as an example in this embodiment, a first electrode 421G and a second electrode 422 of the light-emitting element 420G also serve as the reflective film (corresponding to the reflective electrode 101 and the transparent electrode 102b in FIG. 1) and the semi-transmissive and semi-reflective film (corresponding to the semi-transmissive and semi-reflective electrode 107 in FIG. 1), respectively. Note that the image displaying direction of the display portion 401 is determined in accordance with the direction in which light emitted from the light-emitting element 420G is extracted.

In addition, a light-blocking film 442 is formed so as to surround the color filter 441G. The light-blocking film 442 prevents a phenomenon in which the display panel 400 reflects external light and has an effect of increasing the contrast of images displayed on the display portion 401. Note that the color filter 441G and the light-blocking film 442 are formed on the second substrate 440.

The insulating layer 416 is a layer having insulating properties for planarizing a step due to the structure of the transistor 411 and the like or for suppressing impurity diffusion into the transistor 411 and the like. The insulating layer 416 can be a single layer or a stacked layer. The partition 418 is an insulating layer having an opening; the light-emitting element 420G is formed in the opening of the partition 418.

The light-emitting element 420G includes the first electrode 421G, the second electrode 422, and an EL layer 423.
<Structure of Transistor>

Top-gate transistors are used in the display panel 400 shown as an example in FIG. 3A. However, the present invention is not limited to this example, and bottom-gate transistors may be used. Various types of transistors can be used for the source side driver circuit portion 403s, the gate side driver circuit portion 403g, and the sup-pixels. Note that various semiconductors can be used for regions where channels of these transistors are formed. Specifically, as well as amorphous silicon, polysilicon, or single crystal silicon, an oxide semiconductor or the like can be used.

When a single crystal semiconductor is used for a region where a channel of a transistor is formed, the size of the transistor can be reduced, which results in higher resolution pixels in a display portion.

As a single crystal semiconductor used for forming a semiconductor layer, a semiconductor substrate, such as a single crystal silicon substrate, or a silicon on insulator (SOI) substrate in which a single crystal semiconductor layer is provided on an insulating surface can be used.
<Sealing Structure>

The display panel 400 shown as an example in this embodiment has a structure in which the light-emitting element is sealed in the space 431 enclosed by the first substrate 410, the second substrate 440, and the sealant 405 (see FIGS. 3A and 3B).

The space 431 can be filled with an inert gas (e.g., nitrogen or argon) or resin. An absorbent for impurities (typically, water and/or oxygen) such as a dry agent may be provided in the space 431.

The sealant 405 and the second substrate 440 are desirably formed using a material which transmits impurities in the air (typically, water and/or oxygen) as little as possible. An epoxy-based resin, glass frit, or the like can be used for the sealant 405.

Examples of the second substrate 440 include a glass substrate; a quartz substrate; a plastic substrate formed of polyvinyl fluoride (PVF), polyester, an acrylic resin, or the like; a substrate of fiberglass-reinforced plastics (FRP); and the like.
<Material for Light-Emitting Element>

Next, specific materials for any of the light-emitting elements illustrated in FIG. 1 and FIGS. 3A and 3B are described. Materials for the reflective electrode, the transparent electrode (anode), the semi-transmissive and semi-reflective electrode (cathode), the EL layer, the charge generation layer, the electron-relay layer, and the electron-injection buffer layer are described in that order.
<Material for Reflective Electrode>

A material with high reflectivity is preferably used for the reflective electrode. High reflectivity enables light loss due to absorption to be reduced, resulting in high emission efficiency. Examples of a material with high reflectivity are silver and a silver alloy.
<Material for Transparent Electrode (Anode)>

A polycrystalline conductive oxide material or an amorphous conductive oxide material is used for the transparent electrode. The transparent electrode preferably has a high work function (specifically, a work function of 4.0 eV or more) when used as an anode. Note that in the case where a charge generation layer is provided in contact with the anode, a variety of conductive materials can be used for the anode regardless of their work functions. Specifically, besides a material which has a high work function, a material which has a low work function can also be used for the anode. Materials contained in the charge generation layer will be described later. As the polycrystalline conductive oxide material, ITO, zinc oxide, aluminum-zinc oxide, gallium-zinc oxide, or fluorine-tin oxide can be used. As the amorphous conductive oxide material, indium-zinc oxide or indium-tungsten oxide can be used.
<Material for Semi-Transmissive and Semi-Reflective Electrode (Cathode)>

A material which absorbs little light is preferably used for the semi-transmissive and semi-reflective electrode 107. For example, a thin film of silver can be used. To improve the electron-injection property of the cathode, a material with a low work function (specifically, a work function of less than 4.0 eV) such as magnesium is preferably added to the thin film. Note that in the case where a charge generation layer is provided between the semi-transmissive and semi-reflective electrode 107 and the EL layer 106 to be in contact with the semi-transmissive and semi-reflective electrode 107, a variety of conductive materials can be used for the cathode regardless of their work functions.

<Material for EL Layer>

Specific examples of materials for the layers included in the EL layer will be described below.

<Hole-Injection Layer>

The hole-injection layer contains a substance having a high hole-injection property. As the substance having a high hole-injection property, for example, molybdenum oxide, vanadium oxide, ruthenium oxide, tungsten oxide, manganese oxide, or the like can be used. In addition, it is possible to use a phthalocyanine-based compound such as phthalocyanine (abbreviation: $H_2Pc$) or copper phthalocyanine (abbreviation: CuPc), a high molecule such as poly(3,4-ethylenedioxythiophene)/poly(styrenesulfonic acid) (PEDOT/PSS), or the like to form the hole-injection layer.

Note that a charge generation layer may be used instead of the hole-injection layer. When a charge generation layer is used, a variety of conductive materials can be used for the anode regardless of their work functions. Materials contained in the charge generation layer will be described later.

<Hole-Transport Layer>

The hole-transport layer contains a substance having a high hole-transport property. The hole-transport layer is not limited to a single layer, and may be a stack of two or more layers each containing a substance having a high hole-transport property. The hole-transport layer contains any substance having a higher hole-transport property than an electron-transport property, and preferably contains a substance having a hole mobility of $10^{-6}$ cm$^2$/Vs or higher because the driving voltage of the light-emitting element can be reduced.

<Light-Emitting Layer>

The light-emitting layer contains a light-emitting substance. The light-emitting layer is not limited to a single layer, and may be a stack of two or more layers each containing a light-emitting substance. As the light-emitting substance, a fluorescent compound or a phosphorescent compound can be used. A phosphorescent compound is preferably used as the light-emitting substance because the emission efficiency of the light-emitting element can be increased.

The light-emitting substance is preferably dispersed in a host material. A host material preferably has higher excitation energy than the light-emitting substance.

<Electron-Transport Layer>

The electron-transport layer contains a substance having a high electron-transport property. The electron-transport layer is not limited to a single layer, and may be a stack of two or more layers each containing a substance having a high electron-transport property. The electron-transport layer contains any substance having a higher electron-transport property than a hole-transport property, and preferably contains a substance having an electron mobility of $10^{-6}$ cm$^2$/Vs or higher because the driving voltage of the light-emitting element can be reduced.

<Electron-Injection Layer>

The electron-injection layer contains a substance having a high electron-injection property. The electron-injection layer is not limited to a single layer, and may be a stack of two or more layers each containing a substance having a high electron-injection property. The electron-injection layer is preferably provided because the efficiency of electron injection from the cathode can be increased and the driving voltage of the light-emitting element can be reduced.

As the substance having a high electron-injection property, the following can be given: an alkali metal and an alkaline earth metal such as lithium (Li), cesium (Cs), calcium (Ca) and a compound thereof, such as lithium fluoride (LiF), cesium fluoride (CsF), and calcium fluoride (CaF$_2$). Alternatively, a layer containing a substance having an electron-transport property and an alkali metal, an alkaline earth metal, magnesium (Mg), or a compound thereof (e.g., an Alq layer containing magnesium (Mg)) can be used.

<Material for Charge Generation Layer>

The charge generation layer contains a substance having a high hole-transport property and an acceptor substance with respect to the substance having a high hole-transport property. Note that the charge generation layer is not limited to the structure in which one film contains the substance having a high hole-transport property and the acceptor substance with respect to the substance having a high hole-transport property, and may be a stacked layer of a layer containing the substance having a high hole-transport property and a layer containing the acceptor substance with respect to the substance having a high hole-transport property. Note that in the case where the charge generation layer which is in contact with the cathode has a stacked-layer structure, the layer containing the substance having a high hole-transport property is in contact with the cathode. In the case where the charge generation layer which is in contact with the anode has a stacked-layer structure, the layer containing the acceptor substance with respect to the substance having a high hole-transport property is in contact with the anode.

Note that the acceptor substance with respect to the substance having a high hole-transport property is preferably added to the charge generation layer so that the mass ratio of the acceptor substance to the substance having a high hole-transport property is from 0.1:1 to 4.0:1.

As the acceptor substance with respect to the substance having a high hole-transport property, which is used for the charge generation layer, a transition metal oxide, particularly an oxide of a metal belonging to any of Groups 4 to 8 of the periodic table is preferable. Specifically, molybdenum oxide is particularly preferable. Note that molybdenum oxide has a low hygroscopic property.

As the substance having a high hole-transport property used for the charge generation layer, any of a variety of organic compounds such as an aromatic amine compound, a carbazole derivative, an aromatic hydrocarbon, and a high molecular compound (including an oligomer, a dendrimer, or a polymer) can be used. Specifically, a substance having a hole mobility of $10^{-6}$ cm$^2$/Vs or higher is preferably used. However, any substance other than the above-described materials may also be used as long as the substance has a higher hole-transport property than an electron-transport property.

<Material for Electron-relay Layer>

The electron-relay layer can immediately receive electrons drawn out by the acceptor substance with respect to the substance having a high hole-transport property in the charge generation layer. Hence, the electron-relay layer is a layer containing a substance having a high electron-transport property.

As the substance used for the electron-relay layer, for example, a perylene derivative and a nitrogen-containing condensed aromatic compound can be given. Note that a nitrogen-containing condensed aromatic compound is preferably used for the electron-relay layer because of its stability. Among nitrogen-containing condensed aromatic compounds, a compound having an electron-withdrawing group such as a cyano group or fluorine is preferably used because such a compound further facilitates acceptance of electrons in the electron-relay layer.

<Material for Electron-injection Buffer Layer>

The electron-injection buffer layer facilitates electron injection from the charge generation layer into the light-emitting layer. By providing the electron-injection buffer layer between the charge generation layer and the light-emitting layer, the injection barrier therebetween can be lowered.

A substance having a high electron-injection property can be used for the electron-injection buffer layer. For example, an alkali metal, an alkaline earth metal, a rare earth metal, or a compound thereof (e.g., an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)) can be used.

Further, in the case where the electron-injection buffer layer contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)).

EXAMPLE

One of methods for improving the emission efficiency of a light-emitting element with a tandem structure and a microcavity structure is to use a material with high reflectivity for a reflective electrode. Examples of a material with high reflectivity are silver and a silver alloy. However, even with the use of such a material, when the distance between the reflective electrode and a light-emitting layer is short (e.g., greater than or equal to 5 nm and less than or equal to 100 nm), the emission efficiency is decreased in some cases.

In view of the above, the relation between the emission efficiency and the distance between the light-emitting layer from which light is to be extracted and the reflective electrode was evaluated by samples. The samples were fabricated as follows: low-reflectivity electrode materials and high-reflectivity electrode materials were used for the reflective electrodes 101 and the transparent electrodes 102a to 102c of the first light-emitting element (blue light-emitting element) 220, the second light-emitting element (green light-emitting element) 230, and the third light-emitting element (red light-emitting element) 240 in the light-emitting device shown in FIG. 1. Thus, the influence of the distance between the light-emitting layer and the reflective electrode on the emission efficiency was examined. The results are shown in Table 1.

TABLE 1

| Emission color | Distance between light-emitting layer and reflective electrode | Emission efficiency | | Result with high-reflectivity electrode divided by result with low-reflectivity electrode |
|---|---|---|---|---|
| | | Low-reflectivity electrode (Al—Ti, TiOx, and ITSO stacked in that order) | High-reflectivity electrode (APC and indium-zinc oxide stacked in that order) | |
| Red | 215 nm | 12.9 cd/A | 21.0 cd/A | about 1.62 |
| Green | 155 nm | 29.2 cd/A | 46.0 cd/A | about 1.57 |
| Blue | 40 nm | 2.17 cd/A | 2.07 cd/A | about 0.95 |

A reflective electrode in which an Al—Ti film and a TiOx film are stacked and a transparent electrode of an ITSO film were used for the low-reflectivity electrode, and a reflective electrode of an APC film and a transparent electrode of an amorphous indium-zinc oxide film were used for the high-reflectivity electrode. Note that ITSO is a material obtained by adding silicon to indium tin oxide. APC is an alloy of silver, palladium, and copper.

As shown in Table 1, the use of a material with high reflectivity for the reflective electrodes resulted in increases in the emission efficiencies of the red and green light-emitting elements, in each of which the distance between the light-emitting layer and the reflective electrode is relatively long, and a decrease in the emission efficiency of the blue light-emitting element, in which that distance is short.

This indicates that even when a material with high reflectivity is used for the reflective electrode, a light-emitting element in which the distance between the light-emitting layer and the reflective electrode is short does not provide the expected emission efficiency in some cases. Further, when the distance between the light-emitting layer and the reflective electrode is set long, the decrease in emission efficiency can be prevented, but variations in luminance at different viewing angles become significant. Therefore, it is not preferable to set that distance long.

Figure 4:
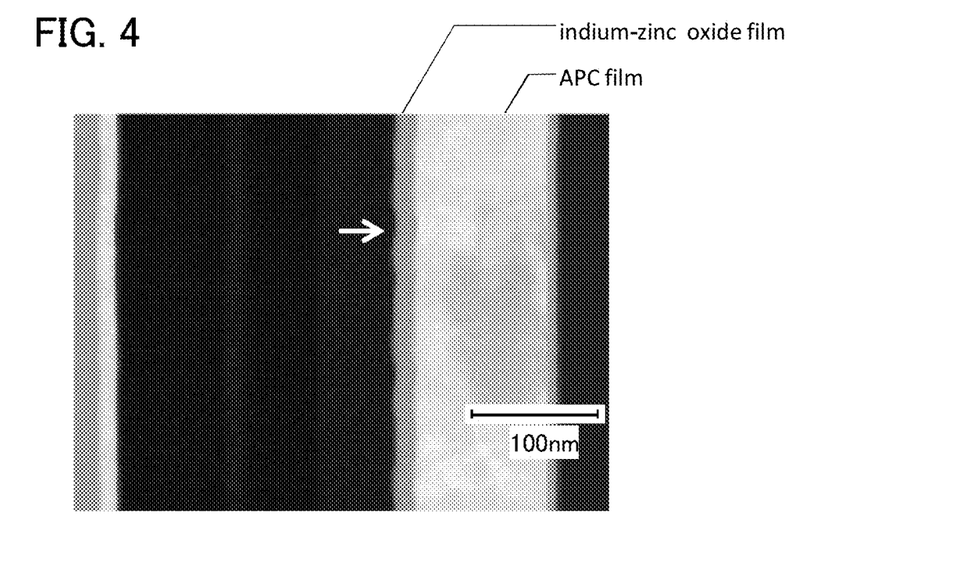
FIG. 4 is a TEM image showing a cross section of a stacked-layer film of an APC film (APC refers to an alloy material of silver (Ag), palladium (Pd), and copper (Cu)) and an amorphous indium-zinc oxide film, which are high-reflectivity materials.
Figure 5:
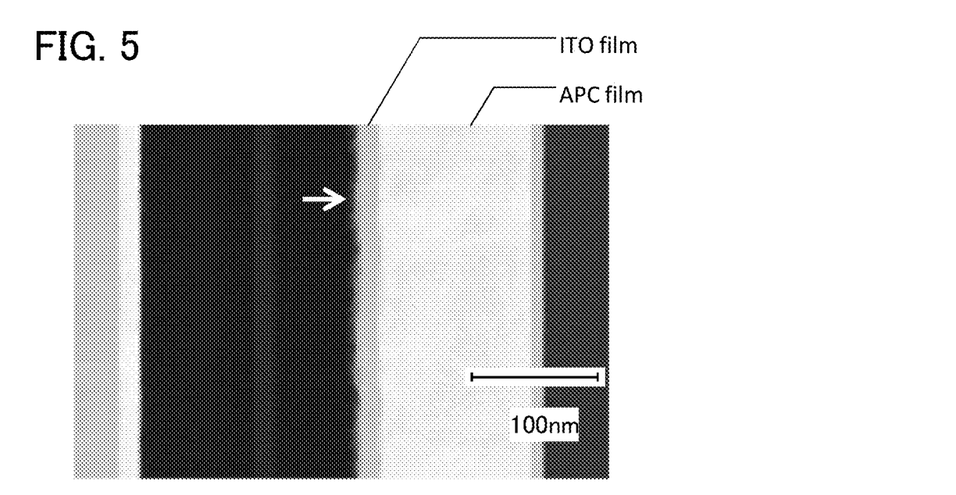
FIG. 5 is a TEM image showing a cross section of a stacked-layer film of an APC film and a polycrystalline ITO film.

FIG. 4 is a cross-sectional TEM image showing a stacked-layer film of an APC film and an amorphous indium-zinc oxide film, which are high-reflectivity materials. FIG. 5 is a cross-sectional TEM image showing a stacked-layer film of an APC film and a polycrystalline ITO film. While the boundary at the surface of the amorphous indium-zinc oxide film is clear, the boundary at the surface of the polycrystalline ITO film is blurred. Since the cross-sectional TEM image includes information on the depth direction of the image, the clearer the boundary at the surface of the film is, the less uneven the surface is. Accordingly, the cross-sectional TEM images in FIG. 4 and FIG. 5 show that the polycrystalline ITO film has a more uneven surface (greater surface roughness) than that of the amorphous indium-zinc oxide film.

Next, the relation between the emission efficiency and the distance between the light-emitting layer 103 (or 104, 105) and the reflective electrode 101 was evaluated by samples. The samples were fabricated as follows: the stacked-layer films shown in FIG. 4 and FIG. 5 were used for the reflective electrodes 101 and the transparent electrodes 102a to 102c of the first light-emitting element (blue light-emitting element)

220, the second light-emitting element (green light-emitting element) 230, and the third light-emitting element (red light-emitting element) 240, in each of which the light-emitting layer 103 from which blue light is emitted is the closest to the reflective electrode 101, shown in FIG. 1. Thus, the influence of the surface roughness of the transparent electrode 102a (or 102b, 102c) on the emission efficiency was examined. The results are shown in Table 2.

TABLE 2

Emission efficiency dependent on material of reflective electrode

| Emission color | Distance between light-emitting layer and reflective electrode | Emission efficiency | |
|---|---|---|---|
| | | Flat surface (APC and indium-zinc oxide stacked in that order) | Uneven surface (APC and ITO stacked in that order) |
| Red | 215 nm | 21.0 cd/A | 11.2 cd/A |
| Green | 155 nm | 46.0 cd/A | 32.7 cd/A |
| Blue | 40 nm | 2.07 cd/A | 2.75 cd/A |

As shown in Table 2, the red and green light-emitting elements, in each of which the distance between the light-emitting layer and the reflective electrode is relatively long, have higher emission efficiencies when the amorphous indium-zinc oxide film with small surface roughness is used for the transparent electrodes than when the polycrystalline ITO film with large surface roughness is used for the transparent electrodes. On the other hand, the blue light-emitting element, in which the distance between the light-emitting layer and the reflective electrode is short, has a higher emission efficiency when the polycrystalline ITO film with large surface roughness is used for the transparent electrodes than when the amorphous indium-zinc oxide film with small surface roughness is used for the transparent electrodes. This is presumably because, although surface plasmon on the reflective electrode causes a decrease in the emission efficiency when the distance between the light-emitting layer and the reflective electrode is short, the uneven surface of the transparent electrode can reduce the influence of the surface plasmon.

The results of Table 1 and Table 2 show the following fact: it is possible to prevent a decrease in the emission efficiency of a light-emitting element which is among light-emitting elements with microcavity structures and in which light is to be extracted from the light-emitting layer closest to a reflective electrode, by using a transparent electrode with a surface roughness larger than those in the other light-emitting elements for that light-emitting element.

A transparent electrode of a light-emitting element in which the distance between a light-emitting layer and a reflective electrode is long preferably has a flat surface. The flatter the transparent electrode surface is, the more the scattering of light emitted from the light-emitting layer can be reduced, leading to higher emission efficiency.

This application is based on Japanese Patent Application serial no. 2013-023576 filed with Japan Patent Office on Feb. 8, 2013, the entire contents of which are hereby incorporated by reference.

What is claimed is:

1. A light-emitting device comprising:
a plurality of light-emitting elements each including:
a reflective electrode;
a transparent electrode over the reflective electrode;
a plurality of light-emitting layers over the transparent electrode, the plurality of light-emitting layers emitting lights of different colors from one another; and
a semi-transmissive and semi-reflective electrode over the plurality of light-emitting layers,
wherein a surface roughness of the transparent electrode in one of the plurality of light-emitting elements is greater than surface roughnesses of the transparent electrodes in the others of the plurality of light-emitting elements,
wherein the one of the plurality of light-emitting elements is configured so that the light emitted from one of the plurality of light-emitting layers, which is the closest to the reflective electrode among the plurality of light-emitting layers, is optically amplified,
wherein the transparent electrode in the one of the plurality of light-emitting elements includes a polycrystalline conductive oxide, and
wherein the transparent electrodes in the others of the plurality of light-emitting elements include an amorphous conductive oxide.

2. The light-emitting device according to claim 1,
wherein a surface of the transparent electrode in the one of the plurality of light-emitting elements includes the polycrystalline conductive oxide, and
wherein surfaces of the transparent electrodes in the others of the plurality of light-emitting elements include the amorphous conductive oxide.

3. The light-emitting device according to claim 1,
wherein the polycrystalline conductive oxide is indium tin oxide, zinc oxide, aluminum-zinc oxide, gallium-zinc oxide, or fluorine-tin oxide, and
wherein the amorphous conductive oxide is indium-zinc oxide or indium-tungsten oxide.

4. The light-emitting device according to claim 1,
wherein the plurality of light-emitting elements include color filters of different colors.

5. The light-emitting device according to claim 1,
wherein the transparent electrodes of the plurality of light-emitting elements differ in thickness from each other.

6. The light-emitting device according to claim 1,
wherein the plurality of light-emitting elements includes a first light-emitting element from which a blue light is extracted, a second light-emitting element from which a green light is extracted, and a third light-emitting element from which a red light is extracted, and
wherein the plurality of light-emitting layers include a first light-emitting layer emitting blue light, a second light-emitting layer emitting green light, and a third light-emitting layer emitting red light.

7. The light-emitting device according to claim 1,
wherein the one of the plurality of light-emitting elements is configured so that a distance between the reflective electrode and the one of the plurality of light-emitting layers ranges from 5 nm to 100 nm.

8. A light-emitting device comprising:
a plurality of light-emitting elements each including:
a reflective electrode;
a transparent electrode over the reflective electrode;
a plurality of light-emitting layers over the transparent electrode, the plurality of light-emitting layers emitting lights of different colors from one another; and
a semi-transmissive and semi-reflective electrode over the plurality of light-emitting layers,
wherein a surface roughness of the transparent electrode in one of the plurality of light-emitting elements is greater than surface roughnesses of the transparent electrodes in the others of the plurality of light-emitting elements, wherein the one of the plurality of light-emitting elements is configured so that the light emitted from one of the plurality of light-emitting layers, which is the closest to the reflective electrode among the plurality of light-emitting layers, is optically amplified, wherein a color of the light is blue, wherein the transparent electrode in the one of the plurality of light-emitting elements includes a polycrystalline conductive oxide, and wherein the transparent electrodes in the others of the plurality of light-emitting elements include an amorphous conductive oxide.

9. The light-emitting device according to claim 8, wherein a surface of the transparent electrode in the one of the plurality of light-emitting elements includes the polycrystalline conductive oxide, and wherein surfaces of the transparent electrodes in the others of the plurality of light-emitting elements include the amorphous conductive oxide.

10. The light-emitting device according to claim 8, wherein the polycrystalline conductive oxide is indium tin oxide, zinc oxide, aluminum-zinc oxide, gallium-zinc oxide, or fluorine-tin oxide, and wherein the amorphous conductive oxide is indium-zinc oxide or indium-tungsten oxide.

11. The light-emitting device according to claim 8, wherein the plurality of light-emitting elements include color filters of different colors.

12. The light-emitting device according to claim 8, wherein the transparent electrodes of the plurality of light-emitting elements differ in thickness from each other.

13. The light-emitting device according to claim 8, wherein the plurality of light-emitting elements includes a first light-emitting element from which a blue light is extracted, a second light-emitting element from which a green light is extracted, and a third light-emitting element from which a red light is extracted, wherein the plurality of light-emitting layers include a first light-emitting layer emitting blue light, a second light-emitting layer emitting green light, and a third light-emitting layer emitting red light, and wherein the one of the plurality of light-emitting elements is the first light-emitting element.

14. The light-emitting device according to claim 8, wherein the one of the plurality of light-emitting elements is configured so that a distance between the reflective electrode and the one of the plurality of light-emitting layers ranges from 5 nm to 100 nm.

\* \* \* \* \*